United States Patent [19]
Luu

[11] Patent Number: 5,631,611
[45] Date of Patent: May 20, 1997

[54] AUTOMATIC MATCHING AND TUNING NETWORK

[75] Inventor: Ky T. Luu, Halifax, Canada

[73] Assignee: Nautel Limited, Tantallon, Canada

[21] Appl. No.: 666,623

[22] Filed: Jun. 18, 1996

[51] Int. Cl.$^6$ ................................................. H03H 7/40
[52] U.S. Cl. ................................. 333/17.3; 343/861
[58] Field of Search ........................ 333/17.3; 343/861; 455/123, 125

[56] References Cited

U.S. PATENT DOCUMENTS

| | | | |
|---|---|---|---|
| 3,117,279 | 1/1964 | Ludvigson et al. | 455/123 |
| 3,160,832 | 12/1964 | Beitman, Jr. et al. | 343/861 X |
| 3,355,667 | 11/1967 | Bruene | 458/123 |
| 3,443,231 | 5/1969 | Roza . | |
| 3,715,690 | 2/1973 | Young et al. | 333/17.1 |
| 3,794,941 | 2/1974 | Templin | 333/17.3 |
| 3,835,379 | 9/1974 | Templin . | |
| 3,919,643 | 11/1975 | Templin . | |
| 3,919,644 | 11/1975 | Smolka . | |
| 3,922,679 | 11/1975 | Campbell | 343/703 |
| 3,995,237 | 11/1976 | Brunner | 333/17.3 |
| 4,015,223 | 3/1977 | Cheze | 333/17.3 |
| 4,112,395 | 9/1978 | Seward | 333/17.3 |
| 4,201,960 | 5/1980 | Skutta et al. | 333/17.3 |
| 4,234,960 | 11/1980 | Spilsbury et al. | 455/123 |
| 4,311,972 | 1/1982 | Landt et al. | 333/17.3 |
| 4,334,187 | 6/1982 | DeSantis . | |
| 4,356,458 | 10/1982 | Armitage | 333/17.3 |
| 4,493,112 | 1/1985 | Bruene | 455/123 |
| 4,679,007 | 7/1987 | Reese et al. | 333/17.3 |
| 4,682,176 | 7/1987 | Jones | 342/175 |
| 4,965,607 | 10/1990 | Wilkins et al. | 343/861 |

*Primary Examiner*—Paul Gensler

[57] ABSTRACT

The present invention relates to a matching and tuning network for connecting a source of RF power to a complex load. The network is comprised of a primary circuit and a secondary circuit. The primary circuit is comprised of a fixed capacitor connected in series with a primary winding of a coupling transformer connected to said source of RF power. The secondary circuit is comprised of a series connection of a secondary winding of said coupling transformer and a variable capacitor connected to said load. The network is further comprised of an input voltage sensor; and an input current sensor both connect to an impedance detector and a phase detector. The impedance detector controls an encoder for varying the coupling between the primary winding and the secondary winding of the coupling transformer to maintain a constant input impedance. The phase detector controls the same encoder for varying the capacity of the variable capacitor so as to maintain a zero phase shift at the input to the network.

10 Claims, 4 Drawing Sheets

AUTOMATIC MATCHING AND TUNING NETWORK

The present invention relates to an automatic matching and tuning network for matching a source of RF energy to a load. More particularly, the source of RF energy is a high power source.

The network is placed between the RF source and the load, and consists of a transformer having a variable coupling, a fixed input capacitor that is sized to resonate with the inductance of the input coil of the transformer, and a variable output capacitor, which when combined with the output reactance of the load to be matched, resonates with the inductance of the output coil of the transformer.

The invention also includes detection circuitry to detect the transformed load impedance at the input of the network and which generates a signal to adjust the transformer coupling coefficient to provide a proper impedance. The detection circuitry also detects the phase at the input to the network and generates another signal which is used to adjust the variable capacitor to provide an input phase of zero degrees.

Prior art techniques for impedance matching employ methods that include the use of "TEE" networks or "PI" networks. These prior art techniques do not allow the adjustment of resistance independent of the phase which makes automatic tuning difficult. In addition, the "TEE" and "PI" networks place a much higher stress on their components for the same matching impedance.

Prior art publications that relate to impedance matching and tuning are described in the following technical literature and United States Patents:

A. Johnson, "The Yaesu Ft-840 HF Transceiver", 73 Amateur Radio Today, Jan. 1995, pp 10–13;

Advertisement, 73 Amateur Radio Today, Jan. 1995;

U.S. Pat. No. 3,794,941, Templin; U.S. Pat. No. 4,493,112 Bruene; U.S. Pat. No. 3,919,644, Smolka; U.S. Pat. No. 3,919,642, Templin and U.S. Pat. No. 3,835,379, Templin.

The Templin Patent, U.S. No. 3,794,941 discloses an automatic antenna impedance tuner. Phase and impedance sensors are used to digitally control motors and switches that change impedance and capacitance devices for tuning a load to a source. However, in the device of this patent, the resistance change is not independent of the reactance change and so that the adjustment of one component alters the tune of the other adjustable component and a hunting action takes place in order to arrive at a correct tune. This hunting action or interdependence of the two adjustable components causes many adjustments of both components before a correct tune is found.

In the embodiment of the present invention, there is no dependence of the value of one of the adjustable components on the other and so first one component can be adjusted and then the other without the hunting action taking place.

The invention provides for an independent adjustment of transformation ratio. When the input inductance of the transformer is resonated with a capacitor and the output inductance of the transformer is resonated with a variable capacitor along with the reactance of the load, the transformation ratio depends solely on the mutual coupling between the input and the output of the transformer as shown below in equation 1. A very large range of transformation ratios can be achieved by this method.

The invention provides electrical isolation between the input and the output of the network due to the spacing of the input and output coils of the transformer.

The invention provides a detection circuit to detect the network input impedance and generate a signal to adjust the position of the input coil of the transformer relative to the output coil to vary the mutual coupling between the input coil and the output coil and thus the transformation ratio of the transformer which adjusts the input impedance of the network.

The invention also provides a detection circuit to detect the network input phase and generates a signal to adjust a capacitor to resonate, along with the load reactance, with the output coil of the transformer to present a zero phase at the input of the network.

The matching and tuning unit inductively couples a resistance and reactive load to an RF generator. The transformer consists of two separate coils, one fixed Ls and one movable Lp in an arc from the vertical. The fixed input capacitor Cp is of a value to resonate with the inductance of the input coil Lp of the transformer. The variable output capacitor Cx is of a value, when combined with the reactance of the load, to resonate with the transformer output coil Ls.

As a result;

$$Zi = XLp - XCp + \{(\omega M)^2/(XLs - XCx + Zload)\}$$

Where Zi is the input impedance of the network, Zload is the complex load equal to (Rload±jXload).

If $M = k(Lp \times Ls)^{1/2}$ and $\omega = 2 \times \pi \times$ frequency; and if $XLp = XCp$ and if $XLs = XCx + Xload$; then $$Zi = (\omega M)^2 Rload \qquad \text{Eq1}$$

The above equations show, with components as described, that with a fixed Rload and fixed frequency, the matching of the impedance is due to the mutual coupling in the transformer and the phase is dependent on the variable capacitor Cx.

The current probe and voltage probe of the present invention provide the proper level of current signal and voltage signal for the impedance detector which provides the control signal to drive the adjustment of the primary coil of the transformer for matching.

The current probe and the voltage probe of the present invention provide the proper level of current signal and voltage signal for the phase detector which provides the control signal to drive the adjustment of the variable capacitor Cx for tuning.

In accordance with one aspect of the present invention, there is provided a matching and tuning network for connecting a source of RF power to a complex load, the network comprising; a primary circuit and a secondary circuit; the primary circuit comprising; a fixed capacitor connected in series with a primary winding of a coupling transformer connected to said source of RF power; the secondary circuit comprising: a series connection of a secondary winding of said coupling transformer and a variable capacitor connected to said load; the network further comprising; input voltage sensing means; and input current sensing means both connect to an impedance detector means; and a phase detector means; wherein the impedance detector means controls means for varying the coupling between said primary winding and said secondary winding of said coupling transformer and said phase detector means controls means for varying the capacity of the variable capacitor so as to maintain a constant input impedance and a zero phase shift at the input to the network.

In accordance with another aspect of the present invention, there is provided a control circuit for controlling a matching and tuning network that connects a source of RF power to a complex load, the network having a variable match transformer and a variable capacitor, the control circuit comprising: a voltage sensor for detecting the input voltage to the network; a current sensor for detecting the input current to the network; an impedance detector connected to the voltage sensor and the current sensor for producing a first signal representative of the input impedance to the network; a phase detector connected to the voltage sensor and the current sensor for producing a second signal representative of the input phase to the network; an encoder connected to the impedance detector and the phase detector for producing first and second control signals; wherein the first control signal controls coupling varying means of said variable coupling transformer, and said second control signal controls capacity varying means of said variable capacitor.

The present invention will now be described in detail with the aid of the accompanying drawings, in which.

It should be noted that like elements in the drawings are identified with like reference numerals.

Figure 1:
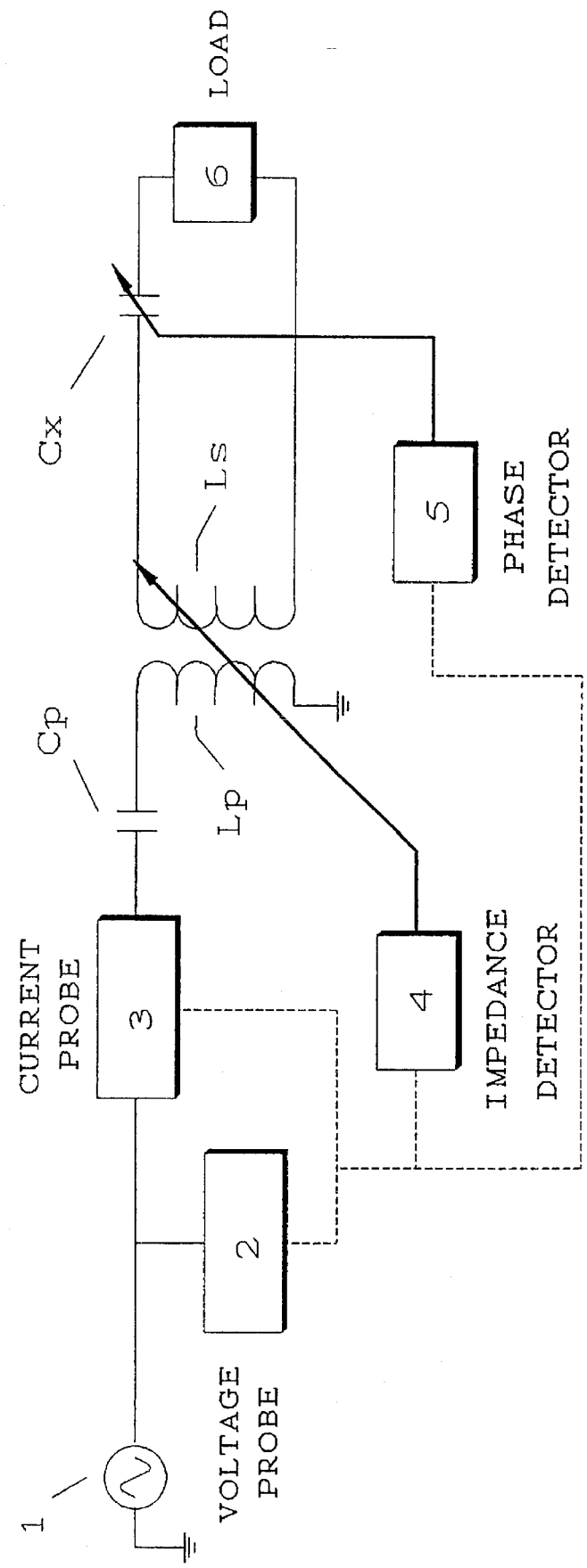
FIG. 1 is a block diagram of the matching network according to one embodiment of the present invention.

FIG. 1 shows a RF source 1, that is to be matched to a load 6. The primary winding Lp of a transformer is connected to ground and to the RF source via a fixed capacitor Cp. A voltage probe 2 is connected to RF source 1 and a current probe 3 is connected in series in the line connecting the capacitor Cp to the RF source 1. The load 6 is connected to a secondary coil Ls of the transformer. A variable capacitor Cx is connected in series with one lead of the secondary winding and the load 6.

The voltage probe and the current probe obtain samples of the voltage and current output of the RF source 1 and are used as inputs to an impedance detector 4 and a phase detector 5. The impedance detector 4 outputs a signal that controls the spacing of the primary and secondary windings of the transformer so as to control the amount of coupling between the input and the output of the matching network.

The operation of the network will now be described in more detail with reference to FIG. 2.

Figure 2:
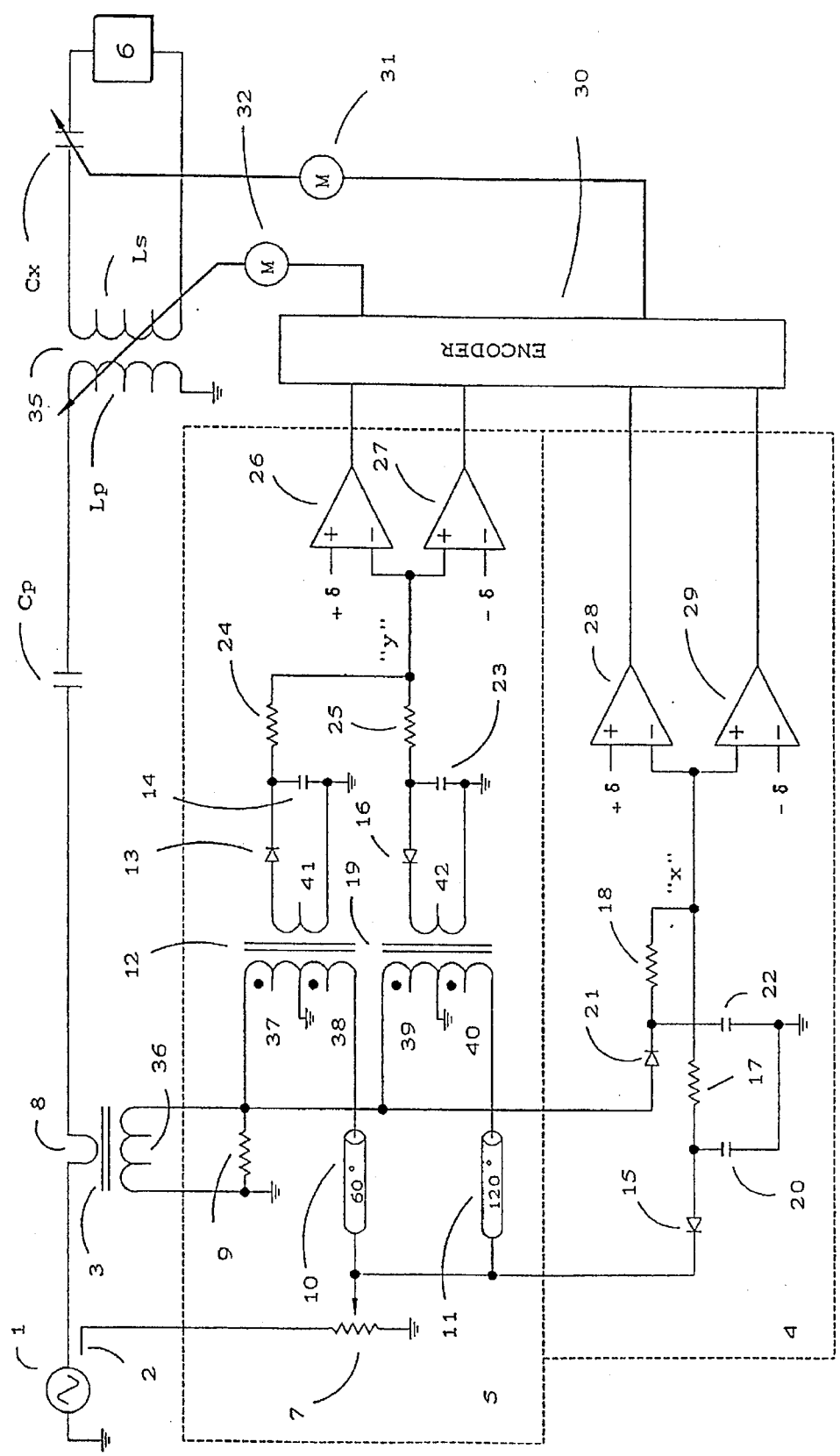
FIG. 2 is a schematic diagram showing the matching and tuning network with detection circuitry of the embodiment of FIG. 1.

An automatic matching and tuning network in accordance with the present invention is shown in detail in FIG. 2. The input to the network is from an RF source 1. The output from the network feeds a complex load 6 having both resistive and reactive components. Samples of the input voltage and current are fed to an impedance detector 4 and a phase detector Outputs of the detectors connect to encoder 30 which provides control signals to motor 31 to adjust the phase of capacitor Cx and to motor 32 to adjust the coupling of transformer 35. Encoder 30 can be a lattice programmable Array Logic GAL20X (trademark) device manufactured by Lattice Semiconductor Corporation Hillsboro Oreg.

The impedance detector 4 consists of voltage input rectifier 15, capacitor 20, resistor 17, the inverting input of comparator 28 and the non-inverting input of comparator 29. The impedance detector 4 also consists of current input rectifier diode 21, capacitor 22, resistor 18, the non-inverting input of comparator 29 and the inverting input of comparator 28. The output of comparators 28 and 29 are connected to the encoder 30.

The input voltage from the RF source 1 is divided down by the capacitor 2 and the variable resistor 7. This circuitry introduces a 90 degree phase advance to the voltage signal. This voltage signal is rectified and filtered by capacitor, resistor combination 20 and 17 and applied to the input of comparators 28 and 29.

The input current is detected by a current transformer 3, consisting of a primary winding 8 and a secondary winding 36. The current is divided down by current transformer 3 and applied to resistor 9 to generate a current signal. The current signal is rectified and filtered by capacitor 22 and resistor 18 and applied to the input of comparators 28 and 29.

When the network is tuned and presents 50 ohms to the input RF signal source 1, the signal level at the wiper of variable resistor 7 and the signal level across current probe resistor 9 will be at the same level. These two signals, after being rectified and filtered are summed at the common node "x" through resistors 17 and 18. The net voltage at "x" is zero volts. The output of comparator 28 will be logic high, ie the rail voltage, and the output of comparator 29 will also be a logic high. The encoder 30 interprets the two high inputs as the network being tuned and does not generate a signal to drive motor 32.

When the input resistance goes higher than 50 ohms, the voltage signal at resistor 7 will increase in level and the current signal at resistor 9 will decrease in level. If the voltage level at node "x" is less than −δ, then the output of comparator 28 will remain at logic high and the output of comparator 29 will go to logic low. These two signals are applied to the encoder 30 and encoded to drive motor 32 in the direction to cause the matching transformer 35 input coil Lp to rotate so as to decrease the transformer's coupling thus causing the input impedance of the network to go to 50 ohms as described by equation 1, above.

When the input resistance goes lower than 50 ohms the voltage signal at resistor 7 will decrease in level and the current signal at resistor 9 will increase in level. If the voltage level at node "x" is greater than +δ, then the output of comparator 29 will remain at logic high and the output of comparator 28 will change to logic low. These two signals are applied to the encoder 30 and encoded to drive motor 32 in the direction to cause the matching transformer 35 input coil Lp to rotate so as to increase the transformer coupling thus causing the input impedance of the network to go to 50 ohms as described by equation 1, above.

The phase detector 5 consists of two phase detectors. One of the phase detectors consists of transformer 12, diode 13, capacitor 14 and resistor 24 connected to the non-inverting input to comparator 27 and the inverting input to comparator 26. The other phase detector is comprised of transformer 19, diode 16, capacitor 23 and resistor 25 also connected to the non-inverting input to comparator 27 and the inverting input of comparator 26. The output of comparators 26 and 27 is each connected to encoder 30. The phase detector 5 also has at the input winding 38 of transformer 12 a delay line 10 of 60 degrees and at the input winding 40 of transformer 19 a delay line 11 of 120 degrees. The phase detector transformers 12 and 19 will output a zero voltage at winding 41 and 42, respectively when the signals at both their input windings 37, 38 and 39 and 40 are in phase.

Figure 3:
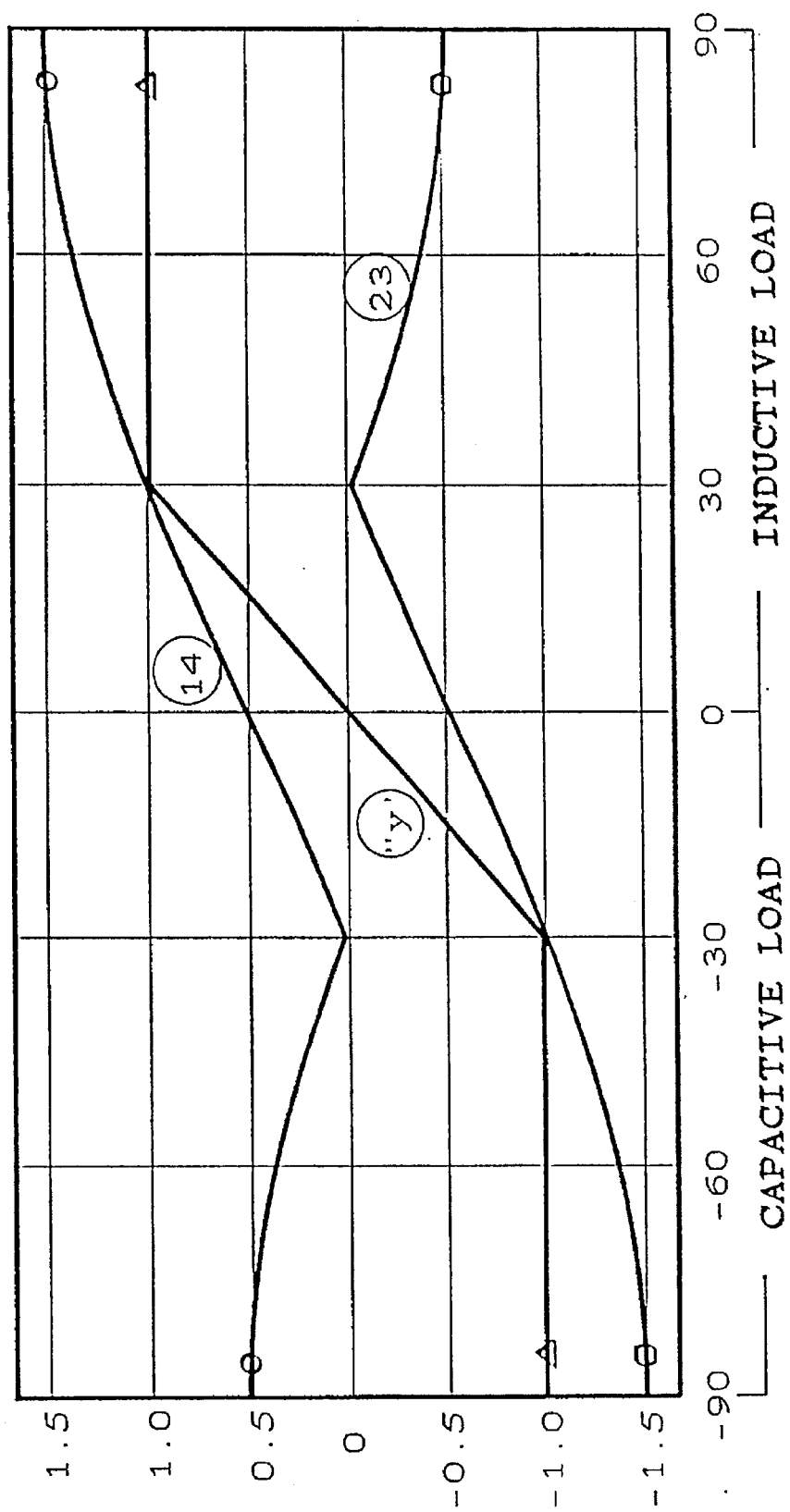
FIG. 3 is a graph used to explain the operation of the circuitry of FIG. 2.

When the input impedance is at zero phase the input voltage and the current are in phase. The divided down voltage signal at the wiper of variable resistor 7 is phase advanced by 90 degrees by the capacitor 2 and resistor 7 combination and is applied to both delay lines 10 and 11. At the point between the 60 degree delay line 10 and the input winding 38 of transformer 12 the voltage leads the current signal by 30 degrees at the input winding 37 of transformer 12. This gives an error signal at the filter capacitor 14 of "A" volts. At the point between the 120 degree delay line 11 and the input winding 40 of transformer 19 the voltage is lagging the current signal by 30 degrees at the input winding 39 of transformer 19. This gives an error signal at the filter capacitor 23 of "A" volts. These two output signals are summed at the common node "y" through resistors 24 and 25. The net voltage at "y" is zero when the input to the network is at zero phase as shown in FIG. 3. The output of comparator 26 will be logic high and the output of comparator 27 will also be logic high. The encoder 30 interprets the two high outputs as the network being tuned and does not generate a signal to drive motor 31.

When the input to the network has a positive phase angle of +10 degrees, i.e. is inductive for this explanation, the current signal will be lagging the voltage signal at the network input by 10 degrees. At the point between the 60 degree delay line 10 and the input winding 38 of transformer 12 the voltage now leads the current signal by 40 degrees at the input winding 37 of transformer 12. This gives an error signal at capacitor 14 of "B" volts which is greater than the phase (tuned) condition. At the point between the 120 degree delay line 11 and the input winding 40 of transformer 19 the voltage now lags the current signal by 20 degrees at the input winding 39 of transformer 19. This gives an error signal at capacitor 23 of "C" volts which is greater than the in-phase condition. These two output signals are summed at the common node "y" and the net voltage at node "y" is now greater than zero volts. If the level at node "y" is greater than +δ, the output of comparator 26 will be logic low and the output of comparator 27 will be logic high. The comparators 26 and 27 output voltage is applied to the encoder 30 which encodes the signal to drive the motor 31 in a direction to cause the capacitor Cx to change value in such a way as to resonate with the output coil Ls of the impedance transformer 35 and the reactance of the load 6 to decrease the input phase to zero phase angle.

When the input to the network has a negative phase angle, say −10 degrees, i.e., capacitive for the purposes of this explanation, the current signal will be leading the voltage signal by 10 degrees. At the point between the 60 degree delay line 10 and the input winding 38 of transformer 12, the voltage now leads the current signal by 20 degrees at the input winding 37 of transformer 12. This gives an error signal at the filter capacitor 14 of "D" volts which is less than the voltage at that point in the in-phase condition. At the point between the 120 degree delay line 11 and the input winding 40 of transformer 19 the voltage is now lagging the current signal by 40 degrees at the input winding 39 of transformer 19. This gives an error signal at the filter capacitor 23 of "E" volts which is less than the in-phase condition. These two output signals are summed at the common node "Y" and the net voltage at node "y" is less than zero volts. If the level at node "y" is less than −δ, then the output of comparator 26 will be logic high and the output of comparator 27 will be logic low. The comparators 26 and 27 output voltage is applied to the encoder 30 which encodes this signal to drive the motor 31 in a direction to cause the capacitor Cx to change value in such a way as to resonate with the output coil Ls of the impedance transformer 35 and the reactance of the load 6 to decrease the input phase to zero phase angle.

FIG. 3 shows the relationship between the voltages across capacitors 14 and 23 with respect to the input phase angle. These voltages result in a voltage at common node "y", as described above. The relationship of the resulting voltage at node "y" with respect to the input phase angle is also shown in FIG. 3.

Figure 4:
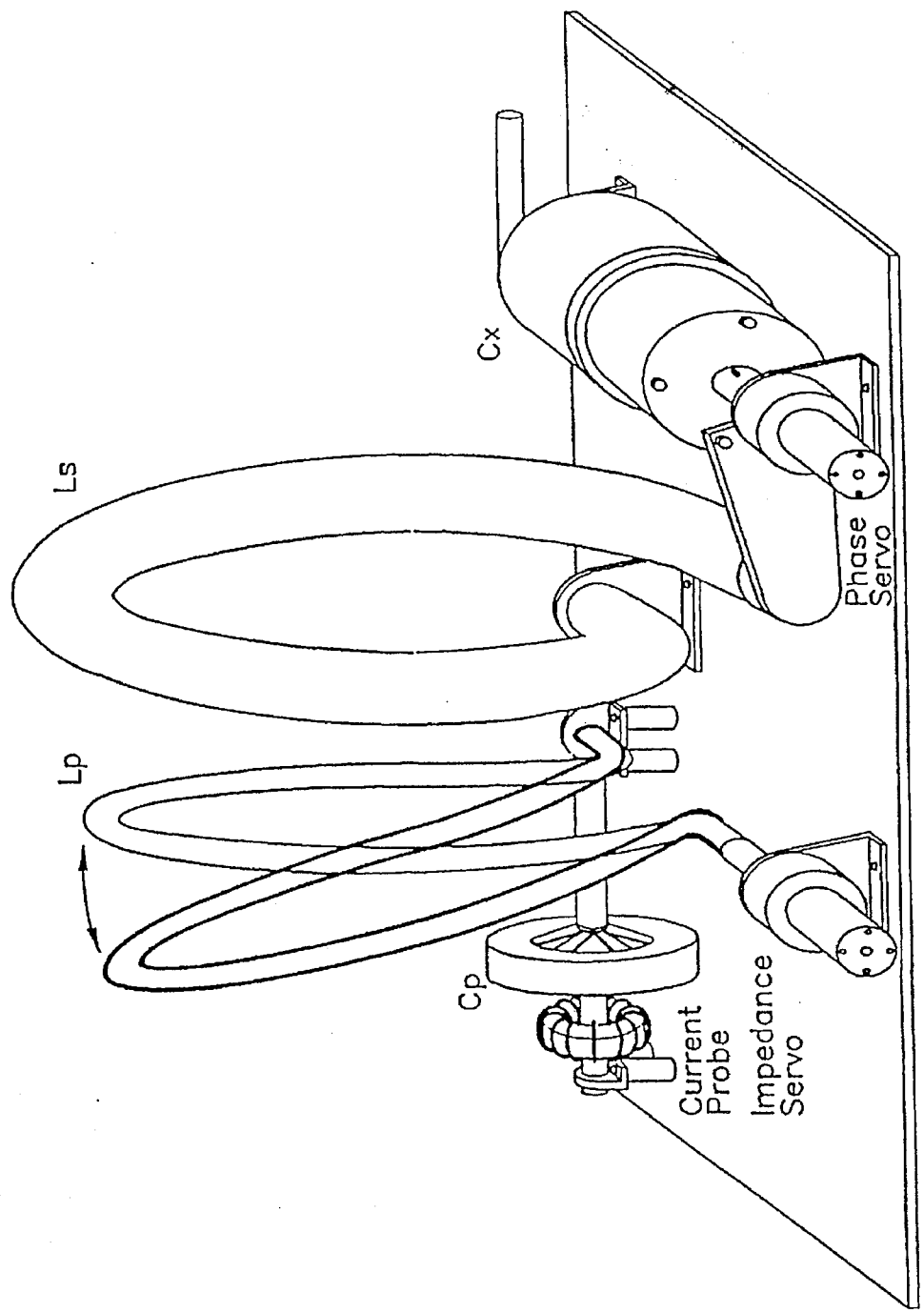
FIG. 4 is a perspective diagram of a network arrangement according to the present invention.

FIG. 4 shows one embodiment of the network of the present invention.

Current probe 3 is the transformer at the immediate left and consists of a coil placed over the RF power lead. Transformer 35, shown in FIG. 2 consists of two coils, Lp and Ls. The coupling of the transformer is altered by moving the coil Lp in an arc toward or away from the fixed secondary coil Ls. Motor 32 and a transmission, make up the impedance servo shown to carry out this movement.

Variable capacitor Cx is connected to the output of coil Ls. The capacity of that capacitor is adjusted by motor 31 and a transmission shown in FIG. 4 as the phase servo.

I claim:

1. A matching and tuning network for connecting a source of RF power to a complex load, the network comprising;
    a primary circuit and a secondary circuit;
    the primary circuit comprising;
        a fixed capacitor connected in series with a primary winding of a coupling transformer connected to said source of RF power;
    the secondary circuit comprising:
        a series connection of a secondary winding of said coupling transformer and a variable capacitor connected to said load;
    the network further comprising;
        input voltage sensing means; and
        input current sensing means both connect to an impedance detector means; and
        a phase detector means;
    wherein the impedance detector means controls means for varying the coupling between said primary winding and said secondary winding of said coupling transformer and said phase detector means controls means for varying the capacity of the variable capacitor so as to maintain a constant input impedance and a zero phase shift at the input to the network.

2. The network of claim 1, wherein the impedance detector is connected to an encoder that controls a first servo motor to vary the coupling of the coupling transformer.

3. The network of claim 2, wherein the phase detector is connected to the encoder that controls a second servo motor to vary the capacity of said variable capacitor.

4. The network of claim 3, wherein the coupling of the coupling transformer is varied by moving the primary coil relative to the secondary coil which is fixed.

5. The network of claim 3, wherein the voltage detector is located at the RF power source and the current detector is located in series in the primary circuit, between the source of RF power and the fixed capacitor.

6. The network of claim 3, wherein the fixed capacitor is sized so as to resonate with the primary winding of said coupling transformer.

7. The network of claim 6, wherein the variable capacitor, when combined with the output reactance of the load, resonates with the secondary winding of the coupling transformer.

8. A control circuit for controlling a matching and tuning network that connects a source of RF power to a complex load, the network having a variable match transformer and a variable capacitor, the control circuit comprising:
    a voltage sensor for detecting the input voltage to the network;
    a current sensor for detecting the input current to the network;
    an impedance detector connected to the voltage sensor and the current sensor for producing a first signal representative of the input impedance to the network;

a phase detector connected to the voltage sensor and the current sensor for producing a second signal representative of the input phase to the network;

an encoder connected to the impedance detector and the phase detector for producing first and second control signals;

wherein the first control signal controls coupling varying means of said variable coupling transformer, and said second control signal controls capacity varying means of said variable capacitor.

9. The control circuit of claim 6, wherein said voltage sensor is comprised of a capacitor connected to said source of RF power and a resistor.

10. The control circuit of claim 6, wherein said current sensor is comprised of a current sensing transformer connected to said source of RF power and a resistor.

* * * * *